United States Patent [19]
Gardner et al.

[11] Patent Number: 6,110,784
[45] Date of Patent: Aug. 29, 2000

[54] METHOD OF INTEGRATION OF NITROGEN BEARING HIGH K FILM

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/123,673

[22] Filed: Jul. 28, 1998

[51] Int. Cl.⁷ .................................................. H01L 21/336
[52] U.S. Cl. .......................... 438/287; 438/287; 438/300; 438/305; 438/308; 438/423; 257/411; 257/640; 257/760
[58] Field of Search .................................. 438/287, 423, 438/520, 258, 299, 308, 306, 305, 300; 257/640, 760, 411

[56] References Cited

U.S. PATENT DOCUMENTS

| | | | |
|---|---|---|---|
| 5,885,877 | 3/1999 | Gardner et al. | 438/300 |
| 5,918,133 | 6/1999 | Gardner et al. | 438/299 |
| 5,937,303 | 8/1999 | Gardner et al. | 438/305 |
| 5,994,749 | 11/1999 | Oda | 257/411 |

OTHER PUBLICATIONS

Stanley Wolf and Richard N. Tauber; *Silicon Processing for the VLSI Era*, vol. 3–*The Submicron MOSFET*; pp. 422–438; 1995.

Stanley Wolf and Richard N. Tauber *Silicon Processing for the VLSI Era, vol. 3– The Submicron MOSFET* pp. 422–438 1995 U.S.

*Primary Examiner*—David Nelms
*Assistant Examiner*—Phuc T. Dang
*Attorney, Agent, or Firm*—Timothy M. Honeycutt

[57] ABSTRACT

A transistor and a method of making the same are provided. The transistor includes a substrate that has an upper surface and a gate dielectric layer positioned on the substrate that has a first quantity of nitrogen therein. A gate electrode is positioned on the gate dielectric layer. First and second source/drain regions are positioned in the substrate and laterally separated to define a channel region beneath the gate dielectric layer. The gate dielectric layer may be composed of a high K material with a thin equivalent thickness of oxide, such as $TiO_2$, $Ta_2O_5$, $CrO_2$ or $SrO_2$. The nitrogen suppresses later oxide formation which may otherwise increase the equivalent thickness of oxide of the gate dielectric layer. Nitrogen may also be incorporated into the substrate and the gate electrode.

23 Claims, 3 Drawing Sheets

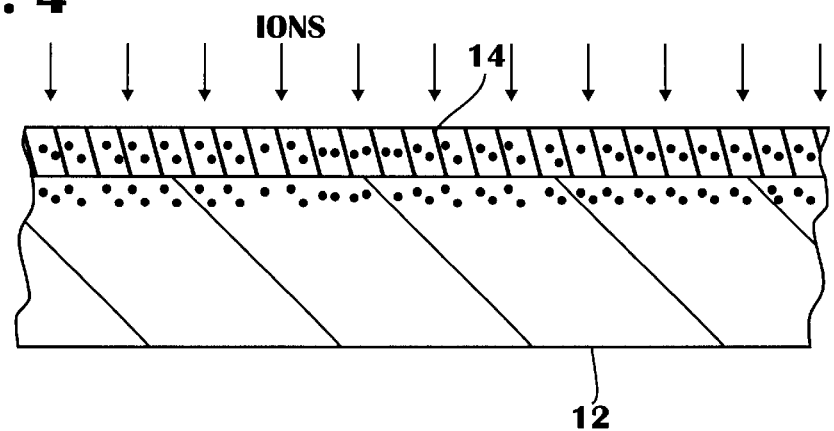
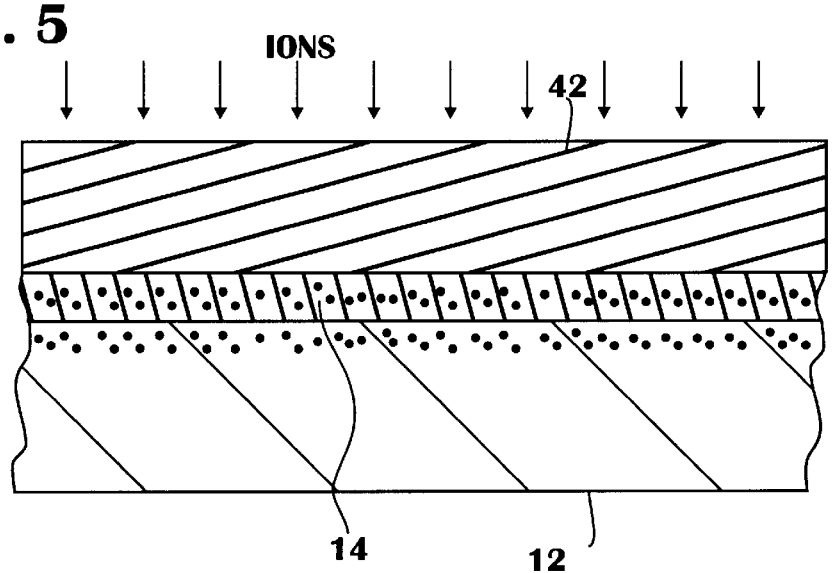
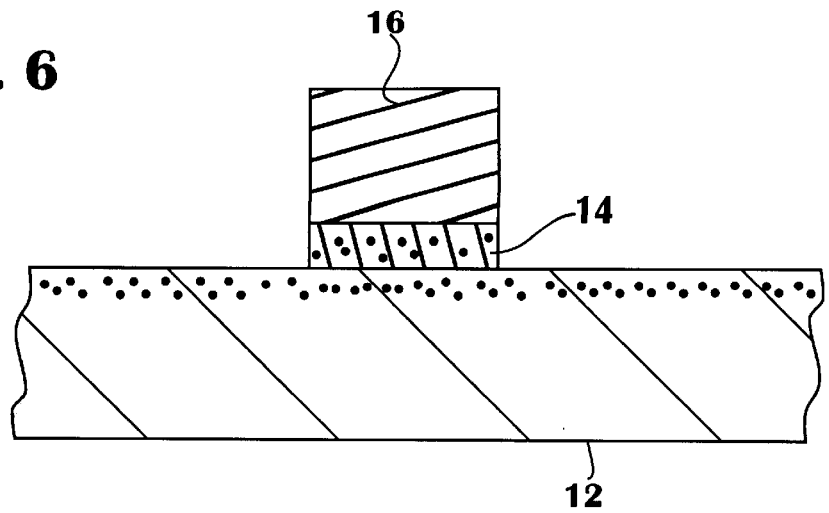

METHOD OF INTEGRATION OF NITROGEN BEARING HIGH K FILM

BACKGROUND OF THE INVENTION

1. Field of the Invention

This invention relates generally to semiconductor processing, and more particularly, to a transistor with a gate dielectric layer that has a high dielectric constant and a level of nitrogen doping, and to a method of making the same.

2. Description of the Related Art

A conventional field effect transistor implemented in silicon typically consists of a source and a drain formed in a silicon substrate, and separated laterally to define a channel region in the substrate. A gate dielectric layer is positioned on the substrate over the channel region and a gate electrode composed of a conducting material, such as aluminum or doped polysilicon, is disposed on the gate dielectric layer. The gate electrode is designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. The first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

The gate dielectric formation aspects of conventional transistor fabrication present certain disadvantages. Silicon dioxide gate oxide layers are made as thin as possible to maximize drive current and to control short channel effects. The requirement for very thin gate oxide layers has become particularly important in sub-micron processing where process scaling has dramatically increased the potential for short channel effects. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot and cold carrier injection degradation increases. Hot and cold carrier degradation can significantly reduce device performance, while dielectric breakdown can lead to complete device failure.

One potential cause of carrier injection and potential dielectric breakdown is thought to occur as a result of interface traps near the Si—$SiO_2$ interface. Interface traps are the apparent result of dangling silicon bonds at the Si—$SiO_2$ interface. Dangling Si bonds represent sites where hot carrier injection, Fowler-Nordheim tunneling and direct tunneling can occur. Although tunneling is thought to arise as a natural consequence of the quantum mechanical nature of electrons positioned near a very thin oxide layer, dangling Si bonds appear to exacerbate the problem. Independent of the exact physical cause of carrier injection, the empirical result for very thin oxides may be gate leakage currents and/or catastrophic device failure.

Another difficulty associated with very thin conventional gate oxides is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion. The potential for boron diffusion increases with decreasing oxide thickness.

One alternative to conventional gate dielectric formation involves the use of an alternative gate dielectric material. One such alternative that has been proposed is tantalum pentoxide ($Ta_2O_5$). Since tantalum pentoxide has a higher dielectric constant ("K") than $SiO_2$, a gate dielectric layer composed of $Ta_2O_5$ can have a greater thickness than a corresponding layer of $SiO_2$, yet have approximately the same equivalent thickness as the $SiO_2$, that is, the same equivalent thickness of oxide ("$t_{OX}$"). A relatively thicker gate dielectric layer can eliminate some of the risks of carrier injection and polysilicon depletion associated with very thin $SiO_2$ layers.

While a relatively thick layer with a thin equivalent tox is desirable, fabricating a layer of $Ta_2O_5$ with an appropriately thin equivalent $t_{OX}$ can prove difficult. The problem stems from the fact that, after formation, a metal oxide layer, such as $Ta_2O_5$, often contains residual oxygen, either in free form or loosely bonded to metal atoms. During any of the various high temperature steps that normally follow gate dielectric formation, the mobile oxygen may migrate and react with other materials, such as the underlying substrate or the overlying polysilicon gate electrode and form oxide. The oxide thus formed translates into an unwanted increase in the equivalent $t_{OX}$ of the gate dielectric layer and a step backward in device performance.

The present invention is directed to overcoming or reducing the effects of one or more of the foregoing disadvantages.

SUMMARY OF THE INVENTION

In accordance with one aspect of the present invention, a transistor is provided. The transistor includes a substrate that has an upper surface and a gate dielectric layer positioned on the substrate that has a first quantity of nitrogen therein. A gate electrode is positioned on the gate dielectric layer. First and second source/drain regions are positioned in the substrate and laterally separated to define a channel region beneath the gate dielectric layer.

In accordance with another aspect of the present invention, a method of fabricating a transistor on a substrate that has an upper surface is provided. The method includes the steps of forming a gate dielectric layer on the substrate wherein the gate dielectric layer has a dielectric constant of about 8 to 120. A first quantity of nitrogen is introduced into the gate dielectric layer. A gate electrode is formed on the gate dielectric layer. First and second source/drain regions are formed in the substrate separated laterally to define a channel region beneath the gate dielectric layer and the gate electrode.

In accordance with another aspect of the present invention, a method of fabricating a gate dielectric layer on a substrate that has an upper surface is provided. The method includes the steps of forming a layer of insulating material on the upper surface wherein the insulating material that has a dielectric constant of about 8 to 120, and introducing a first quantity of nitrogen into the layer of insulating material.

BRIEF DESCRIPTION OF THE DRAWINGS

The foregoing and other advantages of the invention will become apparent upon reading the following detailed description and upon reference to the drawings in which:

FIG. 4 is a cross-sectional view like FIG. 3 depicting an alternate process for introducing nitrogen into the high K gate dielectric layer in accordance with the present invention;

FIG. 5 is a cross-sectional view like FIG. 3 depicting formation of a conducting layer and introduction of nitrogen therein in accordance with the present invention;

FIG. 6 is a cross-sectional view like FIG. 5 depicting definition of a gate electrode from the conducting layer in accordance with the present invention;

DETAILED DESCRIPTION OF SPECIFIC EMBODIMENTS

Figure 1:
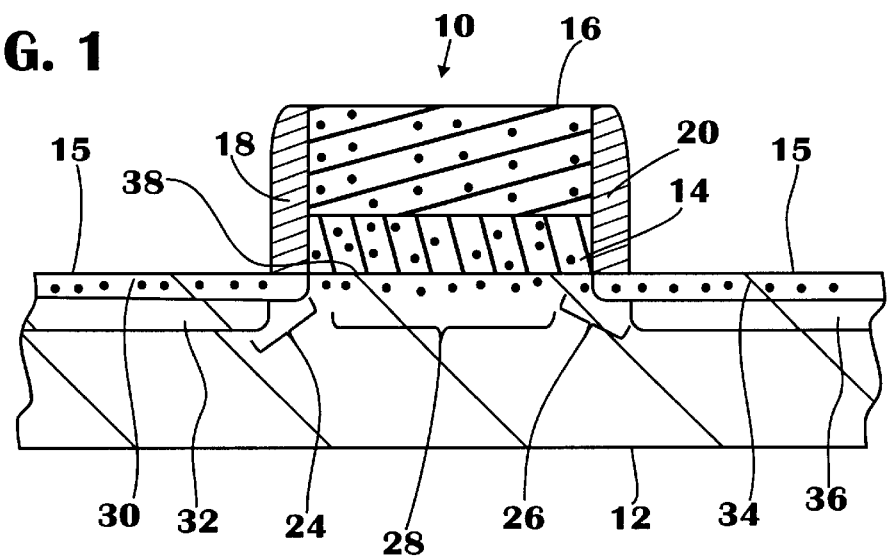
FIG. 1 is a cross-sectional view of an exemplary embodiment of a transistor in accordance with the present invention.

In the drawings described below, reference numerals are generally repeated where identical elements appear in more than one figure. Turning now to the drawings, and in particular to FIG. 1, there is shown a cross-sectional view of an exemplary embodiment of a transistor 10 that is formed on a semiconductor substrate 12. The semiconductor substrate 12 may be composed of n-doped, or p-doped silicon, silicon-on-insulator, or other suitable substrate materials. The transistor 10 includes an insulating or gate dielectric layer 14 that is formed on the upper surface 15 of the substrate 12 and a gate electrode 16 that is formed on the first insulating layer 14. Dielectric sidewall spacers 18 and 20 are positioned adjacent the gate dielectric layer 14 and the gate electrode 16. Source/drain regions 24 and 26 are formed in the substrate 12 and laterally separated to define a channel region 28 beneath the gate dielectric layer 14 and the gate electrode 16. The source/drain region 24 includes a lightly doped drain ("LDD") region 30 and a partially overlapping heavier doped region 32. The source/drain region 26 is provided with identical LDD and heavier doped regions 34 and 36. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization.

The substrate 12, the gate dielectric layer 14 and the gate electrode 16 are provided with quantities of nitrogen. The quantities of nitrogen are represented graphically by the small solid dots. The nitrogen in the substrate 12 serves to tie up dangling Si bonds at the interface 38 between the upper surface 15 of the substrate 12 and the gate dielectric layer 14 that could otherwise lead to tunneling or the formation of additional oxide which would increase the equivalent $t_{OX}$ of the layer 14. The nitrogen in the layer 14 itself provides a check on the thickening of the layer 14 due to oxidation in various high temperature steps following formation of the layer 14. Similarly, the nitrogen in the gate 16 is intended to retard the oxidation of the gate 16 during later heating so that the equivalent $t_{OX}$ of the layer 14 does not increase.

It should be understood that the dots shown in FIG. 1 are merely a graphical representation of the presence of nitrogen dopant, and should not be construed to imply a precise or particular dispersion or concentration. The skilled artisan will appreciate that, like virtually any impurity introduced into the substrate 12, the layer 14 and the gate electrode 16, the nitrogen will be dispersed according to a particular dopant or concentration profile that is dependant upon the parameters of the processes used to introduce the nitrogen and any subsequent processing that occurs following introduction.

Figure 2:
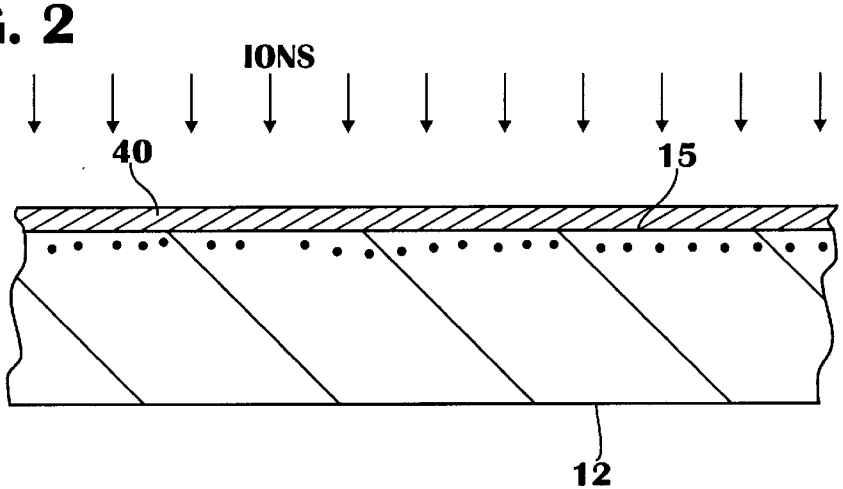
FIG. 2 is a cross-sectional view of a substrate and depicts formation of a sacrificial layer and implantation of nitrogen into the substrate in accordance with the present invention.

An exemplary process flow for forming the transistor 10 may be understood by referring now to FIGS. 2, 3, 5, 6, 7, and 8, and initially to FIG. 2. The process will be described in the context of an n-channel device. However, the skilled artisan will appreciate that the transistor may be implemented as n-channel, p-channel or another type of device. A sacrificial layer 40 is formed on the substrate 12 and a quantity of nitrogen is introduced into the substrate 12 by ion implantation through the sacrificial layer 40. The implanted nitrogen is represented graphically by the solid dots. The nitrogen is introduced to tie up dangling Si bonds that naturally occur at the upper surface 15 of the substrate 12 and provide a barrier to the diffusion of material into the substrate 12, such as boron, during later processing. The elimination of the dangling Si bonds at or near the surface 15 reduces the potential for tunneling due to interface charges. In addition, the elimination of dangling Si bonds reduces the number of sites where oxygen can react with the substrate 12 to form $SiO_2$ that would otherwise increase the equivalent $t_{OX}$ of the later formed gate dielectric layer 14.

The sacrificial layer 40 is provided to modulate the dopant profile of the implanted nitrogen so that the peak concentration thereof is positioned at or near the upper surface 15 of the substrate 12. The layer 40 is advantageously composed of $SiO_2$, or other suitable sacrificial oxide material. The layer 40 may be 50 to 150 Å thick and is advantageously about 100 Å thick. If $SiO_2$ is selected, the layer 40 may be grown by exposing the substrate 12 to an oxygen containing ambient at approximately 800 to 1050° C. for approximately 10 to 60 seconds in a rapid thermal anneal process ("RTA"), or for approximately 5 to 20 minutes in a diffusion tube process. Chemical vapor deposition ("CVD") or like deposition techniques may be used in lieu of thermal oxidation.

If ion implantation is used to introduce the nitrogen, the implant may be carried out with a dosage of about 1E14 to 1E16 ions/cm² and advantageously about 1E15 ions/cm² and an energy of about 10 to 100 keV and advantageously about 60 keV. Alternatively, the nitrogen may be introduced by diffusing a nitrogen bearing species, such as $N_2$, NO, $N_2O$ or other, into the substrate 12 at about 900 to 1100° C. for about 60 to 90 minutes. The sacrificial layer 14 may or may not be used to modulate the diffusion as desired.

The formation of silicon-nitrogen bonds at the upper surface 15 may be encouraged by annealing the substrate 12 following introduction of nitrogen therein. The anneal may be a RTA at about 900 to 1075° C. for about 30 to 60 seconds, and in an inert ambient of argon, helium, nitrogen or other inert gas.

Figure 3:
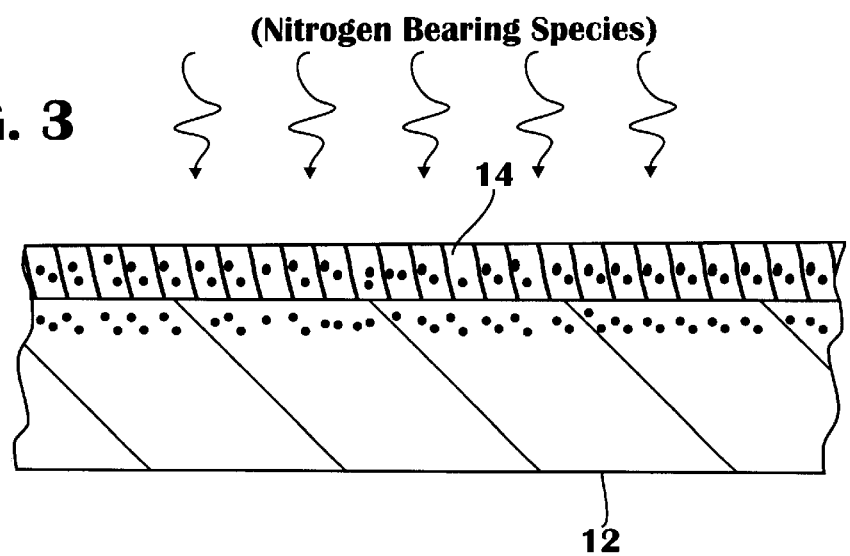
FIG. 3 is a cross-sectional view like FIG. 2 depicting formation of a high K gate dielectric layer and introduction of nitrogen therein in accordance with the present invention.

Referring now to FIGS. 2 and 3, the sacrificial layer 40 is removed by wet etching, dry etching or other suitable removal technique. For example, a wet dip in 10:1 HF followed by RCA cleaning may be used. After the sacrificial layer 40 is removed, the gate dielectric layer 14 is formed.

The gate dielectric layer 14 is advantageously formed by depositing a layer of a high K insulating material on the upper surface 15 of the substrate 12. As noted above, high K materials as gate dielectrics present advantages over conventional gate oxide. The much larger permissible thicknesses of high K gate dielectric layers translates into better resistance to boron penetration and to tunneling caused by quantum mechanical effects, without sacrificing the equivalent $t_{OX}$ of such layers. An equivalent tox of about 5 to 30 Å is desirable. Accordingly, a range of materials and K values may be used. For example, the layer 14 may have a K of about 8 to 120. Exemplary materials includes $TiO_2$, $Ta_2O_5$, $CrO_2$, $SrO_2$ or like materials. The layer 14 may be deposited by low pressure CVD, metal organic CVD, jet vapor deposition, sputter deposition or like techniques. In an exemplary embodiment, The layer 14 may be formed by depositing a layer of material that may form a high K metal oxide material. For example, the layer 14 may be initially established by depositing titanium with a thickness of about 100 to 300 Å and advantageously about 200 Å by CVD. The deposition process establishes a conformal layer of titanium on the upper surface 15.

The layer 14 of oxide forming material is then converted to an oxide by annealing in an oxygen containing ambient. The anneal may be conducted under a variety of conditions. For example, a RTA may be conducted with an ambient of about 50% $O_2$ and a like percentage of an inert gas, such as argon, at about 850 to 1050° C. for about 15 to 30 seconds. The concentration of the inert gas, such as argon, may be varied to control the oxidation rate of the titanium to a desired level. Alternatively, the anneal may be accomplished in a diffusion tube furnace process at about 700 to 800° C. for about 15 minutes.

The conversion of the titanium to titanium dioxide yields a gate dielectric layer 14 with an equivalent $t_{OX}$ of approximately 5 to 25 Å. The result is a gate dielectric layer that exhibits not only a very thin equivalent $t_{OX}$, but also better resistance to dielectric breakdown and injected carrier degradation than conventional gate oxide. The mathematical relationship between the targeted equivalent $t_{OX}$ for the layer 14 and the actual thickness of the $TiO_2$ layer 14 is given by the following equation:

$$\frac{K_{TiO_2}}{K_{SiO_2}} \cdot (\text{Equivalent } t_{ox}) \cong (\text{Thickness of TiO}_2 \text{ Layer}) \quad \text{Equation 1}$$

where $K_{TiO2}$ and $K_{SiO2}$ are the dielectric constants for $TiO_2$ and $SiO_2$. Note that the equation is expressed as an approximation since $TiO_2$ and $SiO_2$ have a range of dielectric constants instead of a single value. For example, $TiO_2$ has a dielectric constant that may range from about 14 to 110.

If $Ta_2O_5$ or another material is selected, the same general regimen may be used to achieve the same thin equivalent $t_{OX}$. The requisite thickness of the layer 14 of $Ta_2O_5$ or other material layer will be given by the above equation when the appropriate K value for $Ta_2O_5$ is substituted.

The application of the layer 14 has been described in the context of a metal deposition followed by oxidation. However, the skilled artisan will appreciate that other techniques may be used. For example, the layer 14 may be applied as an oxide, e.g., $TiO_2$, by CVD, sputter or like techniques.

The layer 14 contains some residual oxygen, either as free atoms or molecules, or bonded oxygen that may readily dissociate during subsequent heating steps. If allowed to migrate as in conventional processing, the residual oxygen can form additional oxides, either through reaction with the substrate 12 or with the later applied gate electrode 16. In either event, the result is an unwanted thickening and attendant increase in the equivalent $t_{OX}$ of the layer 14. This difficulty is overcome by introducing nitrogen into the layer 14 to passivate the layer 14 without increasing the thickness thereof. The nitrogen may be introduced by conducting the anneal of the layer 14 in an ambient containing a nitrogen bearing species such as $N_2$, NO, $N_2O$, $NO_2$ or other. For example, the ambient may contain $O_2$ at about 50% concentration, 10% to 40% argon, and a balance of a nitrogen bearing species in the aforementioned RTA process.

Alternatively, and as depicted in FIG. 4, nitrogen may be introduced into the gate dielectric layer 14 via ion implantation. In an exemplary embodiment, the species is $N_2$. The dosage may be about 1E14 to 1E16 ions/cm² and is advantageously about 1E15 ions/cm². The energy may be about 5 to 50 keV and is advantageously about 30 keV. The infused nitrogen is represented graphically by the solid dots in the layer 14.

Referring now to FIGS. 5 and 6, the gate electrode 16 is fabricated by initially depositing a layer 42 of conducting material on the layer 14. The layer 42 may be composed of a variety of conducting materials, such as, for example, amorphous silicon or polysilicon. In an exemplary embodiment, the layer 42 is polysilicon. Well known techniques for applying polysilicon, such as CVD, may be used to deposit the layer 42. In an exemplary embodiment, the polysilicon is deposited at or above about 625° C. to a thickness of about 750 to 1800 Å, and advantageously to about 1300 Å. Later implants for the source\drain regions 24 and 26 (see FIG. 1) will render the layer 42 conductive.

The layer 42 and the gate electrode 16 subsequently formed therefrom may be susceptible to unwanted oxide formation and a resultant increase in the equivalent $t_{OX}$ of the layer 14 due to the presence of residual oxygen in the layer 14. To counteract the problem, the nitrogen is introduced into the layer 42 by ion implantation of diffusion. The nitrogen is represented graphically by the solid dots in the layer 42 in the FIG. 5 and in the gate 16 in FIG. 6. In an exemplary embodiment, nitrogen is implanted with a dosage of about 1E14 to 5E16 ions/cm² and advantageously about 1E16 ions/cm². The energy may be about 20 to 150 keV and is advantageously about 80 keV. The implant should advantageously position the peak concentration of nitrogen near the interface between the layer 42 and the layer 14. Note that the infused nitrogen will also serve as a polysilicon depletion barrier if the layer is boron doped.

The layer 42 is masked and anisotropically etched to define the gate electrode 16 and remove the portions of the layer 14 lateral to the gate electrode 16. The etch process may be by reactive ion etching, chemical plasma etching, or other like anisotropic etching techniques.

Figure 7:
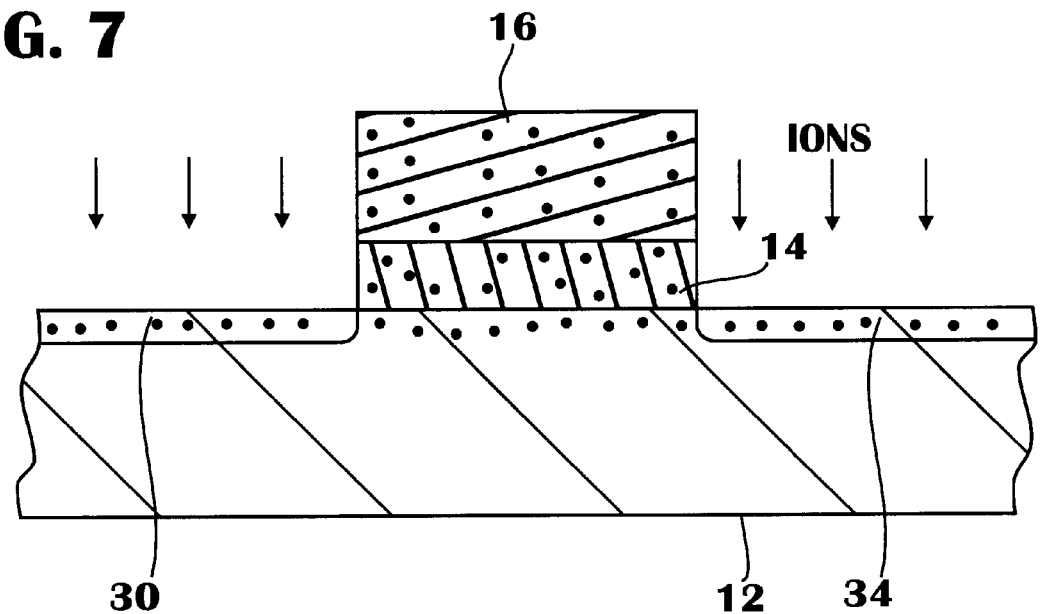
FIG. 7 is a cross-sectional view like FIG. 6 depicting formation of lightly doped drain regions in the substrate in accordance with the present invention.

Referring now to FIG. 7, the LDD regions 30 and 34 are established in the substrate by ion implantation or diffusion as desired. In an exemplary embodiment, the LDD regions 30 and 34 are formed by implanting an n-type dopant, such as arsenic. The particular energy and dosage of the implant (s) will depend upon the dopant type. The dosage may be about 5E13 to 8E14 ions/cm$^2$ and is advantageously about 4E14 ions/cm$^2$. The energy may be about 5 to 30 keV and is advantageously about 20 keV. The implant angle is advantageously 0°.

Figure 8:
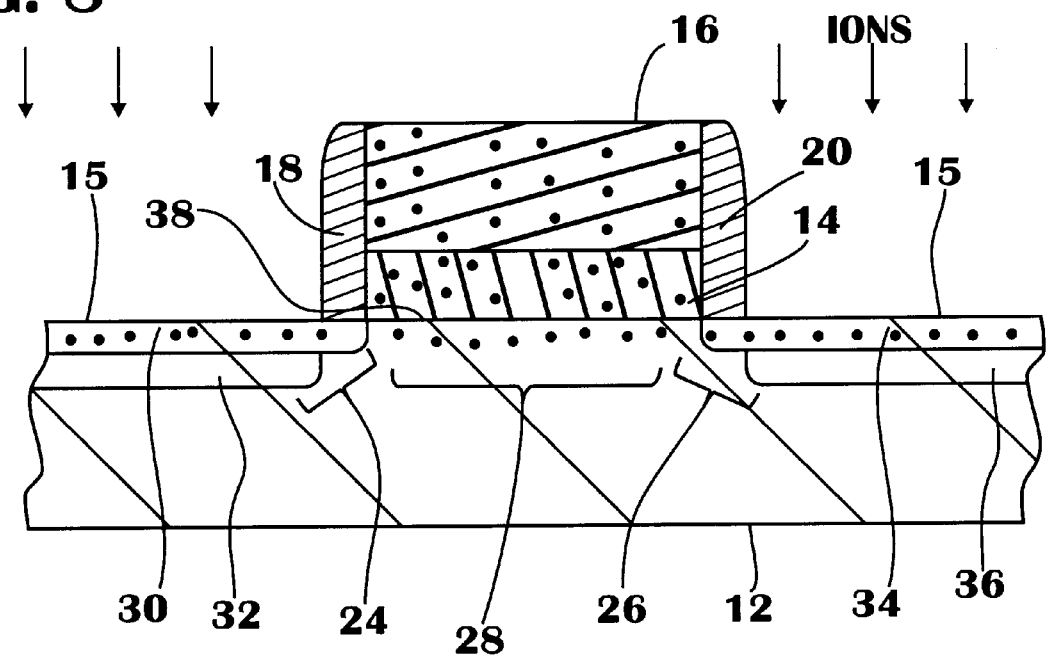
FIG. 8 is a cross-sectional view like FIG. 7 depicting formation of heavier doped regions in the substrate in accordance with the present invention.

Referring now to FIG. 8, the dielectric sidewall spacers 18 and 20 are formed adjacent to the gate electrode 16 and the gate dielectric layer 14, and the heavier doped regions 32 and 36 are established by ion implantation self-aligned to the spacers 18 and 20 as shown. The process used to form the spacers 18 and 20 will depend upon the material selected. For example, if silicon dioxide is selected, the spacers 18 and 20 may be established by CVD of silicon dioxide followed by an anisotropic etch of the deposited oxide that removes the unwanted portions of the layers 18 and 20. CVD may also be used where silicon nitride is selected as the sidewall material.

The energy and dosage for the implant to establish the regions 32 and 36 will depend upon the dopant specie. In an exemplary embodiment, arsenic may be implanted with a dosage of about 2E15 to 7E15 ions/cm$^2$ and advantageously about 4E15 ions/cm$^2$, and an energy of about 5 to 30 keV and advantageously about 20 keV.

The source/drain regions 24 and 26 have been described in the context of a LDD region combined with a heavier doped region. However, the skilled artisan will appreciate that a single implant or a multiple implant process may be used. The lateral separation of the source/drain regions 24 and 26 defines the channel region 28 beneath the gate dielectric layer 14 and the gate electrode 16. The skilled artisan will appreciate that the boundaries of the channel region 28 may migrate during later high temperature steps.

Activation of the source/drain regions 24 and 26 may coincide with one or more of the various high temperature steps that normally accompany metallization. However, the source/drain regions 24 and 26 may be annealed at this stage, if desired. For example, the anneal may be a RTA at about 900 to 1075° C. for about 30 to 60 seconds, and in an inert ambient of argon, helium, nitrogen or other inert gas.

The process in accordance with the present invention yields a transistor that integrates a high K gate dielectric with a corresponding relatively thin equivalent $t_{OX}$. The nitrogen doping in the substrate, the high K gate dielectric layer and the gate electrode provide the transistor with enhanced resistance to hot and cold carrier degradation and establish a process flow that does not appreciably increase the thickness and equivalent $t_{OX}$ of the high K gate dielectric layer during processing.

The aforementioned exemplary embodiments have incorporated nitrogen in the substrate 12, the gate dielectric layer 14 and the gate electrode 16 as a means of reducing the potential for unwanted oxide formation that may increase the equivalent $t_{OX}$ of the layer 14. However, the skilled artisan will appreciate that the advantages of the present invention may be obtained by introducing nitrogen into the gate dielectric layer 14 alone, while further benefits may be obtained by additionally incorporating nitrogen into the substrate 12, and/or the gate electrode 16.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A transistor, comprising:
   a substrate having an upper surface;
   a gate dielectric layer positioned on the substrate and having a first quantity of nitrogen therein;
   a gate electrode positioned on the gate dielectric layer; and
   first and second source/drain regions in the substrate and being laterally separated to define a channel region beneath the gate dielectric layer.

2. The transistor of claim 1, wherein the substrate has a second quantity of nitrogen therein with a peak concentration located proximate the upper surface.

3. The transistor of claim 1, wherein the gate electrode has a third quantity of nitrogen therein with a peak concentration thereof located proximate the gate dielectric layer.

4. The transistor of claim 1, wherein the gate dielectric layer has a dielectric constant of about 8 to 120.

5. The transistor of claim 1, wherein the gate dielectric layer is $TiO_2$, $Ta_2O_5$, $CrO_2$ or $SrO_2$.

6. The transistor of claim 1, wherein the gate dielectric layer is $TiO_2$ or $Ta_2O_5$.

7. The transistor of claim 1, wherein each of the first and second source/drain regions comprises a lightly doped drain region and a heavier doped region.

8. The transistor of claim 7, comprising first and second dielectric sidewall spacers adjacent the gate electrode and gate dielectric layer.

9. A method of fabricating a transistor on a substrate having an upper surface, comprising the steps of:
   forming a gate dielectric layer on the substrate, the gate dielectric layer having a dielectric constant of about 8 to 120;
   introducing a first quantity of nitrogen into the gate dielectric layer by annealing the gate dielectric layer in an ambient containing a nitrogen bearing species wherein the nitrogen bearing species is $N_2$, NO, $N_2O$ or $NO_2$;
   forming a gate electrode on the gate dielectric layer; and
   forming first and second source/drain regions in the substrate.

10. The method of claim 9, comprising the step of introducing a second quantity of nitrogen in the substrate wherein the peak concentration of the nitrogen is located proximate the upper surface.

11. The method of claim 10, wherein the step of introducing the second quantity of nitrogen comprises forming a sacrificial layer on the upper surface, implanting the nitrogen into the substrate, and removing the sacrificial layer.

12. The method of claim 9, comprising the step of introducing a quantity of nitrogen into the gate electrode.

13. The method of claim 12, wherein the step of introducing the quantity of nitrogen comprises implanting nitrogen into the gate electrode.

14. The method of claim 10, comprising the step of introducing a quantity of nitrogen into the gate electrode.

15. The method of claim 9, wherein the step of introducing the first quantity of nitrogen comprises implanting nitrogen into the gate dielectric layer.

16. The method of claim 9, wherein the gate dielectric layer comprises $TiO_2$, $Ta_2O_5$, $CrO_2$ or $SrO_2$.

17. The transistor of claim 9, wherein the gate dielectric layer comprises $TiO_2$ or $Ta_2O_5$.

18. A method of fabricating a gate dielectric layer on a substrate having an upper surface, comprising the steps of:

forming a layer of insulating material on the upper surface, the insulating material having a dielectric constant of about 8 to 120; and introducing a first quantity of nitrogen into the gate dielectric layer by annealing the gate dielectric layer in an ambient containing a nitrogen bearing species wherein the nitrogen bearing species is $N_2$, NO, $N_2O$ or $NO_2$.

19. The method of claim 18, comprising the step of introducing a second quantity of nitrogen in the substrate wherein the peak concentration of the nitrogen is located proximate the upper surface.

20. The method of claim 19, wherein the step of introducing the second quantity of nitrogen comprises forming a sacrificial layer on the upper surface, implanting the nitrogen into the substrate, and removing the sacrificial layer.

21. The method of claim 18, wherein the step of introducing the first quantity of nitrogen comprises implanting nitrogen into the insulating material.

22. The method of claim 18, wherein the insulating material comprises $TiO_2$, $Ta_2O_5$, $CrO_2$ or $SrO_2$.

23. The transistor of claim 18, wherein the insulating material comprises $TiO_2$ or $Ta_2O_5$.

\* \* \* \* \*

UNITED STATES PATENT AND TRADEMARK OFFICE
CERTIFICATE OF CORRECTION

PATENT NO. : 6,110,784
DATED : August 29, 2000
INVENTOR(S) : Mark I. Gardner et al.

It is certified that error appears in the above-identified patent and that said Letters Patent is hereby corrected as shown below:

Delete claims 1-8;

Renumber claim 9 as claim 1;

Renumber claim 10 as claim 2 and change the dependency thereof to claim 1;

Renumber claim 11 as claim 3 and change the dependency thereof to claim 2;

Renumber claim 12 as claim 4 and change the dependency thereof to claim 1;

Renumber claim 13 as claim 5 and change the dependency thereof to claim 4;

Renumber claim 14 as claim 6 and change the dependency thereof to claim 2;

Renumber claim 15 as claim 7 and change the dependency thereof to claim 1;

Renumber claim 16 as claim 8 and change the dependency thereof to claim 1;

Renumber claim 17 as claim 9 and change the dependency thereof to claim 1;

Renumber claim 18 as claim 10;

Renumber claim 19 as claim 11 and change the dependency thereof to claim 10;

Renumber claim 20 as claim 12 and change the dependency thereof to claim 11;

Renumber claim 21 as claim 13 and change the dependency thereof to claim 10;

UNITED STATES PATENT AND TRADEMARK OFFICE
CERTIFICATE OF CORRECTION

PATENT NO.   : 6,110,784
DATED        : August 29, 2000
INVENTOR(S)  : Mark I. Gardner et al.

It is certified that error appears in the above-identified patent and that said Letters Patent is hereby corrected as shown below:

Renumber claim 22 as claim 14 and change the dependency thereof to claim 10;

Renumber claim 23 as claim 15 and change the dependency thereof to claim 10;

Signed and Sealed this

Twenty-third Day of October, 2001

Attest:

*Nicholas P. Godici*

Attesting Officer

NICHOLAS P. GODICI
*Acting Director of the United States Patent and Trademark Office*